United States Patent
Lin et al.

(10) Patent No.: US 6,576,543 B2
(45) Date of Patent: Jun. 10, 2003

(54) METHOD FOR SELECTIVELY DEPOSITING DIFFUSION BARRIERS

(75) Inventors: Jing-Cheng Lin, Hsinchu (TW); Shau-Lin Shue, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 38 days.

(21) Appl. No.: 09/933,976

(22) Filed: Aug. 20, 2001

(65) Prior Publication Data

US 2003/0036263 A1 Feb. 20, 2003

(51) Int. Cl.⁷ ......................................... H01L 21/4763
(52) U.S. Cl. ........................ 438/622; 438/683; 438/687
(58) Field of Search ................................. 438/622, 624, 438/683, 687

(56) References Cited

U.S. PATENT DOCUMENTS

| | | | | |
|---|---|---|---|---|
| 5,595,937 A | * | 1/1997 | Mikagi | 438/687 |
| 5,869,395 A | * | 2/1999 | Yim | 438/687 |
| 6,069,093 A | * | 5/2000 | Tada et al. | 438/761 |
| 6,080,663 A | * | 6/2000 | Chen et al. | 438/637 |
| 6,153,519 A | * | 11/2000 | Jain et al. | 438/681 |
| 6,200,895 B1 | * | 3/2001 | Givins et al. | 438/688 |
| 6,211,085 B1 | * | 4/2001 | Liu | 438/687 |
| 6,214,731 B1 | * | 4/2001 | Nogami et al. | 438/687 |
| 6,271,136 B1 | * | 8/2001 | Shue et al. | 438/687 |
| 6,274,923 B1 | * | 8/2001 | Mikagi | 257/642 |
| 6,306,761 B1 | * | 10/2001 | Taguchi | 438/646 |

OTHER PUBLICATIONS

John L. Vossen Thin Film Processing Academic Press 1978 pp. 41–42.*

* cited by examiner

Primary Examiner—Carl Whitehead, Jr.
Assistant Examiner—David S Blum
(74) Attorney, Agent, or Firm—Tung & Associates

(57) ABSTRACT

A method is provided for selectively depositing a silicided metal diffusion barrier layer in a semiconductor structure to reduce an electrical contact resistance with respect to an underlying copper layer while maintaining a copper diffusion resistance along the semiconductor feature sidewalls including depositing a metal nitride layer over the feature under conditions according to a CVD process such that the metal nitride layer has a relatively higher deposition rate onto feature sidewalls for a period of time compared to a deposition rate over the copper underlayer; and, exposing the metal nitride layer to a silicon containing gaseous ambient under conditions such that silicon is incorporated into the metal nitride layer to form a silicided metal nitride layer having a thickness over the copper underlayer thinner by about 10 Angstroms to 60 Angstroms compared to the feature sidewall thickness.

17 Claims, 1 Drawing Sheet

METHOD FOR SELECTIVELY DEPOSITING DIFFUSION BARRIERS

FIELD OF THE INVENTION

This invention generally relates to diffusion barrier layers and more particularly to selectively deposited metal diffusion barrier layers.

BACKGROUND OF THE INVENTION

The escalating requirements for high density and performance associated with ultra large scale integration semiconductor wiring require increasingly sophisticated interconnection technology. As device sizes decrease it has been increasingly difficult to provide interconnection technology that satisfies the requirements of low RC (resistance capacitance) metal interconnect properties, particularly wherein submicron via/contact holes (inter-layer interconnects) and intra-layer interconnects have increasingly high aspect ratios.

In the fabrication of semiconductor devices, increased device density requires multiple layers, making necessary the provision a multi-layered interconnect structure. Such a multi-layered interconnect structure typically includes intra-layer conductive interconnects (wiring) and inter-layer conductive interconnects formed by openings or holes in an insulating layer (inter-metal dielectric layer). Such holes are commonly referred to as contact holes, i.e., when the hole extends through an insulating layer to an active device area, or vias, i.e., when the hole extends through an insulating layer between two conductive layers. The interface of the metal-metal contact is important since a poor contact will result in higher resistance thereby increasing signal transport times.

In a typical process for forming multiple layer interconnect structure, such as for example, a damascene process, an insulating inter-metal dielectric (IMD) layer is deposited on a conductive layer, an opening is then formed through the IMD by conventional photolithographic and etching techniques, followed by filling the opening with a conductive material, such as tungsten, aluminum or copper. Excess conductive material remaining on the surface of the IMD layer is typically removed by chemical-mechanical polishing (CMP). One such method is known as a dual damascene technique includes the formation of a via hole in communication with an upper trench section, both such openings subsequently simultaneously filled with a conductive material, such as a metal, to form a conductive inter-layer electrical contact with an intra-layer conductive line.

Signal transport speed is of great concern in the semiconductor processing art for obvious performance reasons. The signal transport speed of semiconductor circuitry varies inversely with the resistance and capacitance (RC) of the interconnections. As integrated circuits become more complex and feature sizes decrease, the effect of an RC delay becomes greater.

One way to increase the signal speed of semiconductor circuitry is to reduce the resistance of a conductive interconnects. Aluminum (Al) has been conventionally used for forming conductive interconnects because it is relatively inexpensive, exhibits low resistivity and is relatively easy to etch. However, as the size of openings for vias/contacts and trenches is scaled down to the submicron range, step coverage problems have arisen with the use of Al, decreasing the reliability of interconnections formed between different wiring layers. Decreased step coverage results in high current density and enhanced electromigration.

One approach to improving metal interconnections has included completely filling via holes with plugs of a metal, such as tungsten (W). Many current semiconductor devices use Al for intra-layer interconnects and W plugs for inter-layer interconnections at different levels. However, the use of W has several disadvantages. For example, most W processes are complex and expensive and W has a relatively high resistivity. Consequently, Joule heating of W under high current conditions may enhance electromigration of adjacent Al wiring. Furthermore, W plugs are susceptible to void formation, resulting in poor interface contact and a corresponding high contact resistance at metal interfaces.

Copper (Cu) and copper alloys have been favorably considered for replacing Al and W in VLSI interconnect metallizations. Cu has a lower resistivity than Al, making Cu attractive for intra-layer interconnection wiring. In addition, Cu has improved electrical properties compared to W, making Cu additionally attractive for use as a conductive plug for inter-layer interconnections.

There, however, some disadvantages with the use of Cu or Cu alloys. For example, Cu readily diffuses through silicon dioxide, a typical inter-metal dielectric (IMD) material, and into silicon elements, adversely affecting the electrical properties thereof. For example, Cu is a deep-level dopant in silicon which acts to lower the semiconductor minority lifetime and increases junction leakage current. One solution to this problem has been to form diffusion barrier layers to prevent Cu diffusion. While thicker diffusion barriers may be required, for example, on via sidewalls thereby preventing Cu diffusion into the IMD layer, thinner barrier layers may be preferable at the bottom of the via hole which includes a metallic underlayer, where low resistance between metal contacts is increasingly important. One consideration is that, as barrier thickness decreases below 1 micron, physical vapor deposition (PVD) methods cannot be used due to poor step coverage, making chemical vapor deposition (CVD) the method of choice.

There is therefore a need in the semiconductor processing art to develop a CVD process whereby effective barrier layers may be deposited at varying thickness to maximize their effectiveness, for example, by deposition of a thicker layer on a via sidewall compared to, for example, the via hole bottom which includes a metallic underlayer.

It is therefore an object of the invention to provide a method for depositing diffusion barrier films in semiconductor manufacturing processes whereby relatively thinner diffusion barrier films are selectively deposited in areas between metal-metal contacts while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for selectively depositing a metal diffusion barrier layer in a semiconductor structure to reduce an electrical contact resistance with respect to an underlying copper layer while maintaining a copper diffusion resistance along the semiconductor feature sidewalls.

In a first embodiment according to the present invention, the method includes providing at least one anisotropically etched opening extending through at least one insulating layer and in closed communication with a copper underlayer; depositing a metal nitride layer over the at least one anisotropically etched opening under conditions according to a CVD process such that the metal nitride layer has a relatively higher deposition rate onto sidewalls of the at least one anisotropically etched opening for a period of time compared to a deposition rate over the copper underlayer to form; and, exposing the metal nitride layer to a silicon containing gaseous ambient under conditions such that silicon is incorporated into the metal nitride layer to form a silicided metal nitride layer having a thickness over the copper underlayer thinner by about 10 Angstroms to 60 Angstroms compared to a sidewall thickness.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Figure 1A:
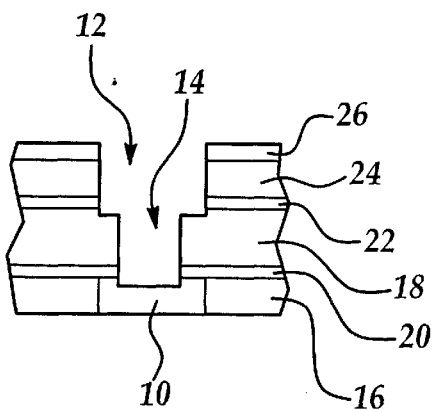
FIG. 1A is a cross-sectional view of a portion of an exemplary semiconductor structure at a processing stage according to the present invention.

The method according to the present invention is more clearly described by referring to FIG. 1A. FIG. 1A shows by way of example, the present invention as applied in a dual damascene process. According to the present invention FIG. 1A depicts a graphical cross-section of a portion of a multiple-layer process wafer at a stage in the manufacturing process. More specifically, in FIG. 1A is shown a stage of a dual damascene process where the trench opening(s) 12 and the via opening(s) 14 may be coated with a diffusion barrier layer prior to filling the openings with metal to form inter-layer metal interconnects by filling via opening(s) 14 and intra-layer metal interconnect wiring by filling trench opening(s) 12.

There are several processing methods well known in the art by which dual damascene via openings 14 and trench openings 12 can be prepared.

For instance, one of the dual damascene methods uses a series of dielectric layers formed over a conductive line 10 patterned in a substrate layer 16. A first inter-metal dielectric (IMD) layer 18 (insulating layer) is formed over the substrate which may also have a first etch stop layer of SiN or SiC 20 overlying the substrate. A second etch stop layer of SiN or SiC 22 is then deposited over the first IMD layer 18. A second IMD layer 24 is then deposited over the second etch stop layer 22. Finally an anti-reflectance coating 26 of, for example, SiON may be deposited over the second IMD layer 24 prior to depositing a photoresist layer (not shown) for patterning of the trench opening(s) 12. The IMD layers 18 and 24 may include any suitable insulating material well known in the art such as silicon dioxide, various glasses, or more recently developed low-k (dielectric constant) materials (organic or inorganic).

The trench opening(s) 12 and via opening(s) 14 may be formed by conventional processing methods known in the art. For example, by first forming the via opening(s) 14 by resist patterning and etching through etch stop layer 22 and IMD layer 18. The trench opening(s) 12 can then be formed in the IMD layer 24 whereby the etch stop layer 22 forms the stop layer for the etch of the trench opening(s) 12. Another approach is to first form the trench opening(s) 12 in the IMD layer 24 whereby the etch stop layer 22 again serves as etch stop. The via opening(s) 14 can then be formed by aligning the etch mask for via opening(s) 14 with the trench opening (s) 12 and etching the via opening(s) 14 through the etch stop layer 22 and the IMD layer 18. Yet another approach is to deposit the dual damascene in two steps, first depositing the IMD layer 18 and the etch stop layer 22. At this point the via opening(s) 14 can be patterned and etched. The IMD layer 24 is then deposited and trench opening(s) 12 patterned and etched. The etch stop layer 22 will stop the etching except where the via opening(s) 14 have already been etched.

Having first formed a semiconductor structure for filling with metal interconnects, for example, in a dual damascene process as explained above, a barrier diffusion layer according to the present invention, is deposited to prevent metal diffusion of the metal filling used to fill the via opening(s) 14 and trench opening(s) 12.

Preferably, according to the present invention, copper (Cu) metal is used as the filling metal in the interconnect structure. The method according to the present invention need not be restricted to Cu metal fillings and may be successfully used with other metals well known in the art, such as Al and W, as well.

Additionally, according to the present invention, the preferred barrier material is TiSiN(i.e., silicided titanium nitride; also represented by the formula TiN(Si)). The TiSiN is preferably deposited according to a chemical vapor deposition (CVD) method. Although physical vapor deposition (PVD) methods may be sufficient for layers thicker than about 100 nanometers, it has been found that CVD provides superior step coverage for barrier layers less than about 100 nanometers thick.

Preferably, after forming the via opening(s) and trench opening(s), the semiconductor process wafer is subjected to a low pressure furnace prebake at a temperature of about 250° C. to about 300° C., followed by a degas within a temperature range of about 250° C. to about 400° C. together with a hydrogen or argon sputter/clean, to prepare the surface for chemical vapor deposition (CVD).

The preferable CVD method is a low temperature method using metal-organic TiN precursors such as TDEAT (tetrakis diethylamino titanium, $Ti(N(CH_2CH_3)_2)_4$), or TDMAT (tetrakis dimethylamino titanium, $Ti(N(CH_3)_2)_4$), to form a MOCVD-metal nitride film. The low temperature process, for example, within a range of about 250° C. to about 450° C., is preferable for several reasons. One reason is that higher temperatures associated with halogenated precursors such as $TiCl_4$ to reduce corrosive effects of residual chlorine are not compatible where, for example, the metal contact underlayer is a low melting point metal such as Cu. Another reason is the diffusion barrier layer may remain amorphous thus providing even greater resistance to metal (e.g., Cu ) diffusion.

According to a preferred CVD process, the TiSiN barrier layer is deposited by first depositing TiN using metal-organic and nitrogen precursors and then soaking the film in ambient $SiH_4$ (silane). Suitable conditions for CVD of TiSiN include maintaining pressure in the deposition chamber within a range of about 0.1 to 10 Torr, and the deposition temperature within a range of about 250° C. to about 450° C. Further, in depositing the TiN , one or more layers may be deposited and the ratio of the metal-organic precursor to nitrogen precursor in the process gas varied in order to vary the content of the film i.e., $Ti_xN_y$ where x and y add up to about 1 and where the subsequently formed TiSiN film has a stoichiometry substantially represented by $Ti_{(x-z)}Si_zN$. By use of the terms 'about' and 'substantially' is meant a value within ten percent of the stated value.

Preferably, the nitrogen precursor is ammonia ($NH_3$), dimethyl amine ($N(CH_3)_2$), or dimethyl amine ($N(C_2H_5)_2$). When introducing a nitrogen precursor, the nitrogen precursor should be selected so that it will not result in undesirable gas phase reactions. For example, ammonia should not be used in connection with TDMAT as it will produce a gas phase reaction that will result in Ti:N being formed within the gas, prior to depositing on the wafer. Preferably, the desired reactions will occur at an upper surface of the wafer depositing the desired material.

In a typical CVD process according to the present invention, an inert carrier gas, such as argon, is used to carry the TiN precursor at a flow rate of between about 100 and 200 sccm. The nitrogen precursor is introduced at between about 1 and 50 sccm to vary the relative amount of nitrogen within the conducting diffusion barrier.

To deposit TiSiN, silane can be introduced between depositions of TiN. The amount of silicon within the final material can be controlled by controlling the amount and duration of silane exposure. Typical operating conditions, for example, include exposing the TiN film to a silane flow rate of about 50–1000 sccm, at a processing pressure of about 10–100 Torr, for a period of about 5–25 seconds within the processing chamber. The temperature is maintained within a range of about 250° C. to about 450° C.

Although the diffusion barrier material is preferably deposited by chemical vapor deposition (CVD) Plasma enhanced chemical vapor deposition (PECVD) could also be used to deposit a diffusion barrier. Further, when depositing an extremely thin amount of diffusion barrier material (e.g., a few nanometers) atomic layer chemical vapor deposition (ALCVD) is preferable.

According to the present invention, it has been unexpectedly found that in depositing a metal nitride, for example, TiSiN onto a metal, for example, Cu, an incubation time is associated with metal nitride deposition onto the metal, compared to, for example, a silicon dioxide insulating layer (IMD layer). That is, the initial rate of deposition of the metal nitride is faster over the insulating material (e.g., via and trench opening sidewalls). As such, the thickness of the diffusion barrier layer is advantageously deposited to a relatively greater thickness on the sidewalls of via and trench openings, thereby providing increased resistance to metal diffusion into the insulating layer (IMD) material, while a relatively thinner diffusion barrier layer is deposited on the via hole bottom over the metal underlayer contact, thereby providing minimal metal-metal contact resistance. Thus, according to the present invention, a diffusion barrier layer is selectively deposited to maximize metal diffusion resistance while minimizing contact resistance, especially where Cu is used as the conductive metal.

Figure 1B:
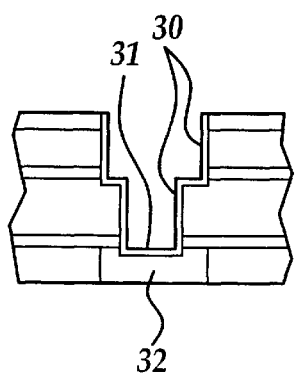
FIG. 1B is a cross-sectional view of a portion of an exemplary semiconductor structure at a processing stage according to the present invention.

Turning to FIG. 1B, is shown a graphical representation of a dual damascene structure after conformally depositing a diffusion barrier layer (e.g., 30) over the via and trench openings. The thickness of the diffusion barrier layer 31 deposited over the metal underlayer contact 32 is relatively thinner compared to the diffusion barrier layer 30 deposited on the via and trench sidewalls. In practice, the difference in thickness between diffusion barrier layers 30 and 31 may range from about 10 to about 60 Angstroms. Preferably, according to the present invention the diffusion barrier layer is deposited to a thickness within a range of about 15 to about 1500 Angstroms.

Figure 2:
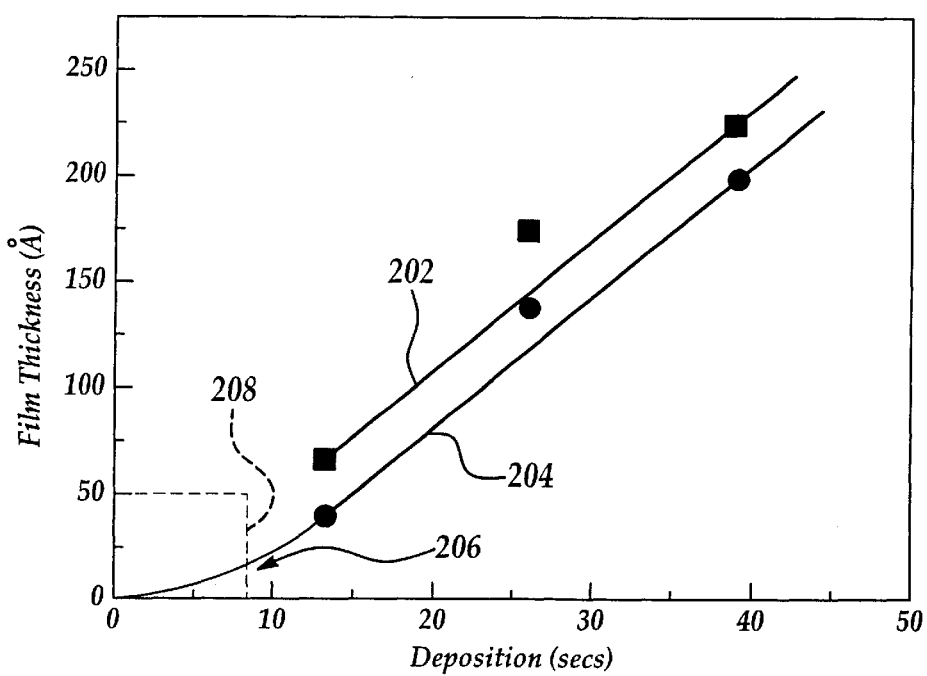
FIG. 2 is a graphical representation of the selectively deposited diffusion barrier layer according to the present invention.

Turning to FIG. 2, a graphical representation of diffusion barrier film thickness is shown on the vertical axis versus deposition time on the horizontal axis according to the present invention. Line 202 represents the thickness of the diffusion barrier layer deposited over the via/trench sidewalls as shown in FIG. 1B at 30 while line 204 represents the thickness of the diffusion barrier layer deposited over the metal underlayer contact(i.e., Cu) following the incubation time period shown at 31 in FIG. 1B.

As demonstrated in FIG. 2 the diffusion barrier layer is initially deposited at a slower rate over the underlayer Cu contact 32, shown by line 204 at time periods up to about 15 seconds, thereby resulting in an incubation time period for diffusion barrier layer (e.g., TiSiN) deposition over the metal (e.g., Cu) underlayer. The relative deposition rates are given by the slopes of the lines 202 and 204. The incubation time period can be estimated by the intersection of lines 208 and 204 at 206. Following the incubation period, the diffusion barrier is deposited at about the same rate over the via and trench sidewalls and the Cu underlayer, resulting in an approximately constant difference in thickness of the deposited films thereafter as represented by the difference in the horizontal axis value between lines 202 and 204 following intersection point 206.

Although the relative initial deposition rates of the diffusion barrier layers and therefore the incubation time period may be varied by altering process conditions, the relative initial deposition rates are preferably adjusted such that the incubation time period of diffusion barrier layer deposition over the metal (e.g., Cu) underlayer results in a difference in relative thickness of deposited diffusion barriers (e.g., vertical axis difference between lines 202 and 204 following intersection point 206) within a range of about 10 to about 60 Angstroms.

Thus, according to the present invention, a silicided metal nitride diffusion barrier layer is selectively deposited by advantageously using the initial deposition selectivity difference between a metal underlayer (e.g., Cu) and the insulating IMD material (e.g., $SiO_2$) making up the sidewalls of the via and trench openings to achieve a relatively greater silicided metal nitride (e.g., TiSiN) diffusion barrier thickness over the via and trench opening sidewalls while achieving a relatively thinner silicided metal nitride diffusion barrier thickness over the metal underlayer contact. As such, a relatively thinner diffusion barrier layer over the metal underlayer contact (e.g., Cu) provides lower contact resistance while providing an effective electromigration diffusion barrier.

Although the above description specifically relates to TiSiN materials, the method according to the present invention can also be applied to silicided metal nitride layers including for example, TaSiN and WSiN by selecting appropriate metal-organic precursors known in the art and varying the relative metal-organic, nitrogen, and silane precursor contents.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for selectively depositing a silicided metal nitride diffusion barrier layer in a semiconductor structure to reduce an electrical contact resistance with respect to an underlying copper layer while maintaining a copper diffusion resistance along the semiconductor feature sidewalls comprising the steps of:

provided at least one anisotropically etched opening extending through at least one insulating layer and in closed communication with a copper underlayer;

depositing a metal nitride layer over the at least one anisotropically etched opening according to a CVD process under conditions such that the metal nitride layer has a relatively higher deposition rate onto sidewalls of the at least one anisotropically etched opening for a period of time compared to a deposition rate over the copper underlayer; and, exposing the metal nitride layer to a silicon containing gaseous ambient under conditions such that silicon is incorporated into the metal nitride layer to form a silicided metal nitride layer having a thickness over the copper underlayer thinner by about 10 Angstroms to about 60 Angstroms compared to a sidewall thickness.

2. The method of claim 1, wherein the steps of depositing and exposing the metal nitride layer are sequentially repeated to form a plurality of silicided metal nitride layers.

3. The method of claim 1, wherein the metal nitride layer is selected from the group consisting of titanium nitride, tantalum nitride, and tungsten nitride.

4. The method of claim 1, wherein the silicon containing gaseous ambient is silane.

5. The method of claim 1, wherein the CVD process comprises using a metal nitride metal-organic precursor and a nitrogen precursor.

6. The method of claim 5, wherein the metal nitride metal-organic precursor is selected from the group consisting of tetrakis diethylamino titanium (TDEAT) and tetrakis dimethylamino titanium (TDMAT).

7. The method of claim 3, wherein the metal nitride layer is maintained within a temperature range of about 250 degrees Centigrade to about 450 degrees Centigrade.

8. The method of claim 1, wherein the metal nitride layer comprises an amorphous structure.

9. The method of claim 1, wherein the metal nitride layer deposition rate onto the sidewalls of the at least one anisotropically etched opening and the deposition rate over the copper underlayer are about equal following an incubation time period.

10. The method of claim 4, wherein the ratio of metal nitride metal-organic precursor to nitrogen precursor are varied to form a metal nitride layer comprising a range of metal nitride compositions approximated by the formula $M_xN_y$ where x+y is about 1.

11. The method of claim 1, wherein the step of exposing the metal nitride layer to a silicon containing gaseous ambient is varied in time such that the metal nitride layer is silicided to a variable extent such that a range of metal nitride layer compositions are formed that are approximated by the formula $M_{(x-z)}Si_zN_y$ where x+y+z is about 1.

12. A method for selectively depositing a silicided titanium nitride diffusion barrier layer in a dual damascene semiconductor structure comprising the steps of:

providing a semiconductor wafer having via openings in open communication with trench openings said via openings extending through at least one insulating layer and in closed communication with a copper underlayer;

subjecting the semiconductor wafer to a thermal treatment to prebake and degas the semiconductor wafer;

subjecting the semiconductor wafer to a plasma sputtering cleaning process;

depositing a titanium nitride layer over the via and trench openings according to a CVD process under conditions such that the titanium nitride layer deposition rate onto sidewalls of the via openings and sidewalls of the trench openings is initially relatively higher compared to a deposition rate onto the copper underlayer; and, exposing the titanium nitride layer to a silicon containing gaseous ambient under conditions such that silicon is incorporated into the metal nitride layer to form a silicided titanium nitride layer having a thickness over the copper underlayer thinner by about 10 Angstroms to about 60 Angstroms compared to a thickness over the sidewalls of the via and trench openings to reduce an electrical contact resistance with respect to the copper underlayer while maintaining a copper diffusion resistance.

13. The method of claim 12, wherein the steps of depositing and exposing the titanium nitride layer are repeated to form a plurality of silicided titanium nitride layers.

14. The method of claim 12, wherein the silicon containing gaseous ambient is silane.

15. The method of claim 12, wherein the process comprises the use of a titanium nitride metal-organic precursor and a nitrogen precursor.

16. The method of claim 15, wherein the metal nitride metal-organic precursor is selected from the group consisting of tetrakis diethylamino titanium (TDEAT) and tetrakis dimethylamino titanium (TDMAT).

17. The method of claim 12, wherein the titanium nitride layer deposition rate onto the sidewalls of the via openings and the sidewalls of the trench openings is about equal to the deposition rate onto the copper underlayer following an incubation time period.

* * * * *